United States Patent
Inoue

(10) Patent No.: US 8,679,625 B2
(45) Date of Patent: Mar. 25, 2014

(54) SOLAR CELL SEALING FILM AND SOLAR CELL USING THE SEALING FILM

(75) Inventor: Yoshihiko Inoue, Yokohama (JP)

(73) Assignee: Bridgestone Corporation, Tokyo (JP)

( * ) Notice: Subject to any disclaimer, the term of this patent is extended or adjusted under 35 U.S.C. 154(b) by 199 days.

(21) Appl. No.: 13/148,995

(22) PCT Filed: Feb. 12, 2010

(86) PCT No.: PCT/JP2010/052034
§ 371 (c)(1),
(2), (4) Date: Aug. 11, 2011

(87) PCT Pub. No.: WO2010/093005
PCT Pub. Date: Aug. 19, 2010

(65) Prior Publication Data
US 2011/0319517 A1    Dec. 29, 2011

(30) Foreign Application Priority Data

Feb. 12, 2009 (JP) ................................. 2009-029341

(51) Int. Cl.
*B32B 5/16*       (2006.01)

(52) U.S. Cl.
USPC ............ 428/330; 428/402; 524/424; 524/436

(58) Field of Classification Search
USPC ........................... 524/424, 436; 428/330, 402
See application file for complete search history.

(56) References Cited

U.S. PATENT DOCUMENTS

| 5,290,613 | A | 3/1994 | Shuetz et al. |
| 2002/0185170 | A1 | 12/2002 | Shiotsuka et al. |

FOREIGN PATENT DOCUMENTS

| EP | 0 301 509 | A1 | | 2/1989 | |
| JP | 64-006041 | A | | 1/1989 | |
| JP | 64-36654 | A | | 2/1989 | |
| JP | 4-232740 | A | | 8/1992 | |
| JP | 8-059945 | A | | 3/1996 | |
| JP | 2000-174296 | A | | 6/2000 | |
| JP | 2001-181445 | A | | 7/2001 | |
| JP | 2005-029588 | A | | 2/2005 | |
| JP | 2005029588 | A | * | 2/2005 | ................. C08J 5/18 |
| JP | 2007-202501 | A | | 8/2007 | |
| JP | 2008-118073 | A | | 5/2008 | |
| JP | 2008118073 | A | * | 5/2008 | ............... C08K 3/22 |
| WO | 2008/056730 | A1 | | 5/2008 | |

OTHER PUBLICATIONS

Extended European Search Report dated Jul. 23, 2013 in European Application No. 10741282.7.

* cited by examiner

*Primary Examiner* — James J Siedleck
*Assistant Examiner* — Marie Reddick
(74) *Attorney, Agent, or Firm* — Sughrue Mion, PLLC

(57) ABSTRACT

The present invention is to provide a solar cell sealing film which suppresses occurrence of rust on conducting wires or electrodes and which is improved in transparency and generating efficiency of the solar cell, and a solar cell having the sealing film. The solar cell sealing film comprises ethylene-vinyl acetate copolymer, a crosslinker and an adsorbent, which comprises, as the adsorbent, an inorganic fine particle having refractive index of not more than 1.54 in an amount of 0.1 to 1.5 part by weight based on 100 parts by weight of the ethylene-vinyl acetate copolymer.

4 Claims, 1 Drawing Sheet

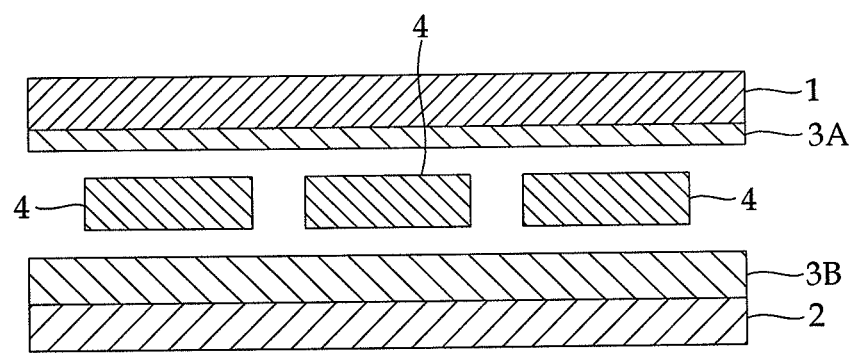

SOLAR CELL SEALING FILM AND SOLAR CELL USING THE SEALING FILM

CROSS REFERENCE TO RELATED APPLICATIONS

This application is a National Stage of International Application No. PCT/JP2010/052034 filed Feb. 12, 2010, claiming priority based on Japanese Patent Application No. 2009-029341 filed Feb. 12, 2009, the contents of all of which are incorporated herein by reference in their entirety.

FIELD OF THE INVENTION

The present invention relates to a solar cell sealing film consisting chiefly of ethylene-vinyl acetate copolymer and a solar cell using the sealing film, particularly those which are excellent in transparency and generating efficiency.

DESCRIPTION OF THE RELATED ART

A solar cell (solar cell module) has been widely employed as a device directly converting solar energy into electric energy from the view-points of the effective use of natural resources and the prevention of environmental pollution, and is further developed.

As shown in FIG. 1, a solar cell has a structure that plural photovoltaic elements 4 (e.g., photovoltaic elements made of silicon) are sealed through a light-receiving side (front side) sealing film 3A and a backside sealing film 3B between a transparent light-receiving (front side) protection material 1 and a backside protection material 2 (backside covering member), the sealing films 3A and 3B consisting of EVA (ethylene-vinyl acetate copolymer).

The solar cell can be prepared by superposing a transparent light-receiving side (front side) protection material 1, a light-receiving side (front side) sealing film 3A, plural photovoltaic elements 4, a backside sealing film 3B and a backside protection material 2, in this order, and heating them under application of pressure to crosslink or cure EVA, whereby they are bonded and combined.

When a solar cell is used under environment at high temperature and humidity or weathered outdoor environment for long time period, moisture or water is apt to enter the inside of the solar cell. The water entering the inside of the cell reaches conducting wires or electrodes within the solar cell to erode them to generate rust, and as a result, the solar cell is reduced in generating efficiency or durability.

So far, a glass plate has been used as a transparent light-receiving side protection material in order to enhance the durability of the solar cell by preventing occurrence of rust on conducting wires or electrodes within the cell (for example, Patent Document 1). However, even such solar cell sealed sufficiently does not acquire highly enhanced durability including prevention of occurrence of rust.

It is strongly desired that light incident upon the solar cell is effectively taken into the photovoltaic elements of the solar cell as much as possible and focused to the photovoltaic elements, in order to enhance electric generation performance of the solar cell. From this viewpoint, it is preferred to use as a sealing film used for a solar cell a film having high transparency, and properties not absorbing or reflecting light incident upon the solar cell and allowing the light to almost pass through. Therefore, an EVA film having colorless and transparent properties and excellent water resistance is generally used as the sealing film for a solar cell.

However, the EVA film contains vinyl acetate as its constituent, and hence is apt to be hydrolyzed with time by moisture and water at high temperature whereby acetic acid is generated. The generated acetic acid is considered to be in contact with conducting wires or electrodes within the cell to accelerate the occurrence of rust. Hence, it is most effective to prevent the contact between acetic acid and the conducting wires or electrodes within the solar cell, in order to highly prevent the occurrence of rust within the solar cell.

Patent Document 2 discloses an EVA film containing an acid acceptor having mean particle size of not more than 5 μm in the amount of not more than 0.5% by weight as a transparent film usable in, for example, a sealing film of a solar cell (solar cell sealing film). The EVA film containing the acid acceptor suppresses the generation of acetic acid from the film and therefore enables the enhancement of durability of the solar cell.

PRIOR ART DOCUMENTS

Patent Document

Patent Document 1: JP(TOKKAI) 2000-174296 A
Patent Document 2: JP(TOKKAI) 2005-29588 A

SUMMARY OF THE INVENTION

Problem to be solved by the Invention

According to the study of the present inventor, though the use of a metal oxide compound such as MgO or ZnO as an acid acceptor enables suppression of the generation of carboxylic acid (e.g., acetic acid), the EVA film containing the metal oxide compound is reduced in transparency, which occasionally brings about poor appearance or reduction of generating efficiency.

Thus, the object of the present invention is to provide a solar cell sealing film which suppresses occurrence of rust on conducting wires or electrodes and which is improved in transparency and generating efficiency of the solar cell.

Further, the object of the present invention is to provide a solar cell which is improved in transparency and generating efficiency.

Means for Solving Problem

The above-mentioned object can be attained by a solar cell sealing film comprising ethylene-vinyl acetate copolymer, a crosslinker and an adsorbent,
which comprises, as the adsorbent, an inorganic fine particle having refractive index of not more than 1.54 in an amount of 0.1 to 1.5 part by weight based on 100 parts by weight of the ethylene-vinyl acetate copolymer.

The preferred embodiments of the solar cell sealing film according to the present invention are described as follows:

(1) The refractive index of the inorganic fine particle is in the range of 1.45 to 1.54. The reduction of the transparency of the EVA film can be suppressed.

(2) The pH of the inorganic fine particle is not less than 9.0. Generated acetic acid can be easily trapped.

(3) The inorganic fine particle is a fine particle of a composite metal compound having at least two metals having different numbers of positive charges from each other. The two metals of the composite metal compound preferably are Mg and Al. A molar ratio of Mg to Al preferably is in the range of 2 to 3. Excellent absorption action is obtained and at the same time reduction of the transparency of the EVA film is suppressed.

(4) The inorganic fine particle is composed of natural or synthetic hydrotalcite. Excellent absorption action is obtained and at the same time reduction of the transparency of the EVA film is suppressed.

(5) The hydrotalcite is represented by the following chemical formula:

$$Mg_{4.5}Al_2(OH)_{13}CO_3\cdot 3.5H_2O. \qquad \text{[Formula 1]}$$

(6) The adsorbent is contained in an amount of 0.2 to 1.0 part by weight based on 100 parts by weight of the ethylene-vinyl acetate copolymer.

(7) The vinyl acetate of the ethylene-vinyl acetate copolymer is contained in an amount of 5 to 50 parts by weight based on 100 parts by weight of the ethylene-vinyl acetate copolymer.

(8) The crosslinker is contained in an amount of 0.1 to 5.0 parts by weight based on 100 parts by weight of the ethylene-vinyl acetate copolymer.

Further the present invention is provided by a solar cell wherein the solar cell sealing film of the present invention is incorporated.

Effect of the Invention

The solar cell sealing film according to the present invention comprises ethylene-vinyl acetate copolymer (EVA) as a chief ingredient and contains, as the adsorbent, an inorganic fine particle having refractive index of not more than 1.54 in a predetermined amount. A solar cell using the solar cell sealing film is suppressed in reduction of transparency even if the sealing film contains an inorganic fine particle (e.g., a conventional acid acceptor) having refractive index of more than 1.54. Therefore, reduction of generating efficiency of the solar cell can be also suppressed. Further, the adsorbent is capable of trapping carboxylic acid such as acetic acid generated by hydrolysis of the sealing film to suppress occurrence of rust on electric wires or electrodes. Thus, a solar cell in which reduction of generating efficiency caused by a long-term use is suppressed can be obtained.

BRIEF DESCRIPTION OF THE DRAWINGS

FIG. 1 is a section view of a conventional solar cell.

MODE FOR CARRYING OUT THE INVENTION

The solar cell sealing film according to the present invention comprises ethylene-vinyl acetate copolymer (EVA) as a chief ingredient and further contains a specific adsorbent. The solar cell sealing film of the invention is used as a sealing film 3A, 3B shown in FIG. 1 set forth above.

The solar cell sealing film preferably has a high transparency (low haze) in order to allow a large amount of light incident upon the solar cell to enter the photovoltaic elements of the solar cell, and hence a light-receiving side sealing film arranged on the light-receiving side of the solar cell is required to have particularly high transparency. Thus, in the invention, an inorganic fine particle having refractive index of not more than 1.54 (preferably the range of 1.45 to 1.54) is contained as an absorbent in the sealing film in order to suppress reduction of transparency of the sealing film. The use of the absorbent having the refractive index enables reduction of the transparency because the refractive index is near to that of used EVA.

Thus, the solar cell sealing film of the invention brings about suppression of occurrence of rust on electric wires or electrodes, and at the same time shows enhanced transparency and generating efficiency, and further enables these characteristics to be kept for a long term.

The absorbent of the invention is an inorganic fine particle having refractive index of not more than 1.54 (preferably the range of 1.45 to 1.54). The inorganic fine particle generally has functions adsorbing or absorbing acid such as acetic acid. The inorganic fine particle preferably has pH of not less than 9.0, especially 9.0 to 10, whereby acetic acid generated within a solar cell can be easily adsorbed.

The inorganic fine particle generally is a fine particle of a composite metal compound having at least two metals having different numbers of positive charges from each other. The two metals of the composite metal compound preferably are Mg and Al. A molar ratio of Mg to Al preferably is in the range of 2 to 3.

The inorganic fine particle preferably is a fine particle of natural or synthetic hydrotalcite. The natural hydrotalcite is preferably represented by the following general formula (I):

[Formula 2]

$$M^1{}_{8-X}M^2{}_X(OH)_{16}CO_2\cdot nH_2O \qquad (I)$$

in which $M^1$ represents $Mg^{2+}$, $Fe^{2+}$, $Ca^{2+}$, $Ni^{2+}$, $Co^{2+}$ or $Cu^{2+}$, $M^2$ represents $Al^{3+}$, $Fe^{3+}$ or $Mn^{3+}$, X is in the range of 2 to 5, and n is not less than 0. The natural hydrotalcite has a layered structure and is capable of intercalating anion (e.g., carboxylic ion) between the layers. $M^1$ preferably represents $Mg^{2+}$, and $M^2$ preferably represents $Al^{3+}$. A molar ratio of Mg to Al preferably is in the range of 2 to 3.

The synthetic hydrotalcite is preferably represented by the following general formula (II):

[Formula 3]

$$M^1{}_Y M^2{}_Z(OH)_m CO_2\cdot nH_2O \qquad (II)$$

in which $M^1$ represents $Mg^{2+}$, $Fe^{2+}$, $Ca^{2+}$, $Ni^{2+}$, $Co^{2+}$ or $Cu^{2+}$, $M^2$ represents $Al^{3+}$, $Fe^{3+}$ or $Mn^{3+}$, Y is in the range of 4 to 7, Z is in the range of 2 to 3, m is in the range of 10 to 18, and n is not less than 0. The synthetic hydrotalcite also has a layered structure and is capable of intercalating anion (e.g., carboxylic ion) between the layers. $M^1$ preferably represents $Mg^{2+}$, and $M^2$ preferably represents $Al^{3+}$. A molar ratio of Mg to Al preferably is in the range of 2 to 3. Particularly, the hydrotalcite is preferably represented by the following chemical formula:

[Formula 4]

$$Mg_{4.5}Al_2(OH)_{13}CO_3\cdot 3.5H_2O$$

Examples of commercially available synthetic hydrotalcites include Trade name "HT-P" (available from Sakai Chemical Industry Co., Ltd.; $Mg_{4.5}Al_2(OH)_{13}CO_3\cdot 3.5H_2O$; mean particle size: 0.5 μm; refractive index: 1.51; pH=9.5), and Trade name "DHT-4" (available from Kyowa Chemical Industry Co., Ltd.; $Mg_{4.3}Al_2(OH)_{12}CO_3\cdot H_2O$; mean particle size: 0.5 μm; refractive index: 1.51; pH=9.5). Particularly, the former is useful because is capable of giving a reduced haze.

In addition to the inorganic fine particle, if necessary, other absorbents (which are generally used as an acid acceptor) such as metal oxide, metal hydroxide, metal carbonate or composite metal hydroxide may be secondarily used. Examples of the other absorbents include oxides, hydroxides, carbonates, carboxylates, silicates, borates, phosphites and metaborates of the second group metal of the periodic table such as magnesium oxide, calcium oxide, magnesium hydroxide, calcium hydroxide, barium hydroxide, magnesium carbonate, barium carbonate, calcium carbonate, calcium borate, zinc stearate, calcium phthalate, calcium phosphite, zinc oxide, calcium silicate, magnesium silicate, magnesium borate, magnesium metaborate and barium metaborate; oxides, basic carbonates, basic carboxylates, basic phosphites and basic sulfites of the 14th group metal of the periodic table such as tin oxide, basic tin carbonate, tin stearate, basic tin phosphite, basic tin sulfite, trilead tetraoxide, silicon oxide and silicon stearate; zinc oxide, aluminum oxide, aluminum hydroxide, iron hydroxide; gel compound of aluminum hydroxide.

The adsorbent (inorganic fine particle) is contained in an amount of 0.1 to 1.5 part by weight based on 100 parts by weight of the ethylene-vinyl acetate copolymer contained in the sealing film. The inorganic fine particle is preferably contained in an amount of 0.2 to 1.0 part by weight, more preferably 0.3 to 0.7 part by weight, based on 100 parts by weight of the ethylene-vinyl acetate copolymer. If the inorganic fine particle is contained in an amount of more than 1.5 part by weight, the resultant sealing film is apt to be reduced in transparency, whereas if the inorganic fine particle is contained in an amount of less than 0.1 part by weight, the resultant sealing film is not apt to acquire sufficient adsorption characteristic.

Though the sealing film of the invention comprises ethylene-vinyl acetate copolymer, the film, if necessary, may secondarily contain polyvinyl acetal resin such as polyvinyl formal, polyvinyl butyral (PVB resin) or modified PVB, or vinyl chloride resin. However, it is preferred to use only ethylene-vinyl acetate copolymer.

In the sealing film, the content of vinyl acetate (recurring unit) in ethylene-vinyl acetate copolymer preferably is in the range of 5 to 50% by weight, especially 10 to 40% by weight based on 100 parts by weight of ethylene-vinyl acetate copolymer. When the content of vinyl acetate is less than 5% by weight, the sealing film crosslinked and cured at high temperature does not occasionally show sufficiently high transparency. On the other hand, when the content of vinyl acetate is more than 50% by weight, the EVA is apt to generate acetic acid or the like.

The thickness generally is in the range of 50 μm to 2 mm, though is not restricted.

The sealing film of the present invention includes a crosslinker in addition to ethylene-vinyl acetate copolymer and the adsorbent. The sealing film of the invention generally contains organic peroxide or photopolymerization initiator as a crosslinker. The organic peroxide is preferably used because the resultant sealing film is improved in temperature dependency in adhesion, transparency, humidity resistance and penetration resistance.

Any organic peroxides that can be decomposed at a temperature of not less than 100° C. to generate radical(s) can be employed as the above-mentioned organic peroxide. The organic peroxide is selected in the consideration of film-forming temperature, conditions for preparing the composition, curing (bonding) temperature, heat resistance of body to be bonded, storage stability. Especially, preferred are those having a decomposition temperature of not less than 70° C. in a half-life of 10 hours.

From the viewpoint of resin processing temperature and storage stability, examples of the organic peroxides include benzoyl peroxide-type cure agents, tert-hexyl peroxypyvalate, tert-butyl peroxypyvalate, 3,5,5-trimethyl hexanoyl peroxide, di-n-octanoyl peroxide, lauroyl peroxide, stearoyl peroxide, 1,1,3,3-tetramethylbutylperoxy-2-ethyl hexanoate, succinic acid peroxide, 2,5-dimethyl-2,5-di(2-ethylhaxanoylperoxy)hexane, 1-cyclohexyl-1-methylethylperoxy-2-ethyl hexanoate, tert-hexylperoxy-2-ethyl hexanoate, benzoyl peroxide, 2,5-dimethylhexyl-2,5-bisperoxy benzoate, p-chlorobenzoyl peroxide, m-toluoyl peroxide, 2,4-dicyclobenzoyl peroxide, tert-butylperoxy benzoate, 4-methylbenzoyl peroxide, tert-butylperoxy-2-ethyl hexanoate, m-toluoyl+benzoyl peroxide, 1,1-bis(tert-butylperoxy)-2-methylcyclohexanate, 1.1-bis(tert-hexylperoxy)-3,3,5-trimethylcyclohexanate, 1,1-bis(tert-hexylperoxy)cyclohexanate, 1,1-bis(tert-butylperoxy)-3,3,5-trimethylcyclohexane 1,1-bis(tert-butylperoxy)cyclohexanate, 2,2-bis(4,4-di-tert-butylperoxycyclohexyl)propane, 1,1-bis(tert-butylperoxy) cyclododecane, tert-hexylperoxyisopropyl monocarbonate, tert-butylperoxy maleic acid, tert-butylperoxy-3,3,5-trimethyl hexanoate, tert-butyl peroxylaurate, 2,5-dimethyl-2,5-di(methylbenzoylperoxy)hexane, tert-butylperoxyisopropyl monocarbonate, tert-butylperoxy-2-ethylhexyl monocarbonate, tert-hexyl peroxybenzoate, and dialkyl peroxides such as 2,5-di-methyl-2,5-di(t-butylperoxy)hexane.

Dialkyl peroxides such as 2,5-di-methyl-2,5-di(t-butylperoxy)hexane are preferred because of a small amount of pyrolysis gas generated at crosslinking temperature.

The content of the crosslinker in the sealing film preferably is in the range of 0.1 to 2 parts by weight, in particular 0.2 to 1.5 parts by weight based on 100 parts by weight of ethylene-vinyl acetate copolymer. When the content of the cross-linking agent is less, the transparency of the sealing film is apt to be reduced. When the content of the cross-linking agent is excessive, the compatibility of the crosslinker with the copolymer is apt to be reduced.

Any known photopolymerization initiators can be employed as the crosslinker. Preferred are initiators having good storage stability after addition thereof.

Examples of the photopolymerization initiators include acetophenone type initiators such as 2-hydroxy-2-methyl-1-phenylpropane-1-on, 1-hydroxycyclohexylphenylketone, 2-methyl-1-[4-(methylthio)phenyl]-2-morphorino-propane-1-on; benzoin type initiators such as benzylmethylketal; and the benzophenone type initiators such as benzophenone, 4-phenylbenzophenone and hydroxybenzophenone; thioxanthone type initiators such as isopropylthioxanthone and 2,4-diethylhioxanthone. Further, as special type, there can be mentioned methylphenylglyoxylate. Especially preferred are 2-hydroxy-2-methyl-1-phenylpropane-1-on, 1-hydroxycyclohexylphenylketone, 2-methyl-1-[4-(methylthio)phenyl]-2-morphorinopropane-1-on and benzophenone. These photopolymerization initiators can be employed together with one or more kinds of a photopolymerization promoter such as a benzoic acid type compound (e.g., 4-dimethylaminobezoic acid) or a tertiary amine compound by mixing the initiator with the promoter in optional ratio. The initiator can be employed singly or in combination of two or more kinds.

The photopolymerization initiator is preferably contained in the composition in the range of 0.5 to 5.0 parts by weight based on 100 parts by weight of ethylene-polar monomer copolymer.

The sealing film of the invention can contain, if necessary, various additives such as plasticizers, adhesion improvers, acryloxy group-containing compounds, methacryloxy group-containing compounds, epoxy group-containing compounds and cross-linking auxiliaries for improvement or adjustment of various properties of the resultant film (e.g., mechanical strength, adhesive property (adhesion), optical characteristics such as transparency, heat resistance, light-resistance, cross-linking rate), particularly for improvement mechanical strength.

Though any plasticizers can be used with not restricted, esters of polybasic acids and esters of polyhydric alcohols are generally used. Examples of the esters include dioctyl phthalate, dihexyl adipate, triethylene glycol-di-2-ethylbutylate, butyl sebacate, tetraethylene glycol diheptanoate, triethylene glycol diperalgonate. The plasticizer may be used singly or in combination of two or more kinds. The plasticizer is preferably contained in an amount of not more than 5 parts by weight based on 100 parts by weight of EVA.

Silane-coupling agent can be used as the adhesion improver. Examples of the silane coupling agents include γ-chloropropylmethoxysilane, vinyltrichlorosilane, vinyltriethoxysilane, vinyltris(β-methoxyethoxy)silane, γ-methacryloxypropyltrimethoxysilane, β-(3,4-epoxycyclohexyl) ethyltrimethoxysilane, γ-glycidoxypropyltriethoxysilane, vinyltriacetoxysilane, γ-mercaptopropyltrimethoxysilane, γ-aminopropyltriethoxysilane and N-β-(aminoethyl)-γ-aminopropyltrimethoxysilane. The silane-coupling agent is preferably contained in an amount of not more than 5 parts by weight, more preferably 0.1 to 2 part by weight, based on 100 parts by weight of EVA.

Examples of the acryloxy and methacryloxy group containing compounds include generally derivatives of acrylic acid or methacrylic acid, such as esters and amides of acrylic acid or methacrylic acid. Examples of the ester residue include linear alkyl groups (e.g., methyl, ethyl, dodecyl, stearyl and lauryl), a cyclohexyl group, a tetrahydrofurfuryl group, an aminoethyl group, a 2-hydroxyethyl group, a 3-hydroxypropyl group, 3-chloro-2-hydroxypropyl group. Example of the amide includes diacetone acrylamide. Further, examples of the esters include esters of acrylic acid or methacrylic acid with polyhydric alcohol such as ethylene glycol, triethylene glycol, polypropylene glycol, polyethylene glycol, trimethylol propane or pentaerythritol.

Examples of the epoxy group containing compounds include triglycidyl tris(2-hydroxyethyl)isocyanurate, neopentylglycol diglycidyl ether, 1,6-hexanediol diglycidyl ether, allyl glycidyl ether, 2-ethylhexyl glycidyl ether, phenyl glycidyl ether, phenol(ethyleneoxy)$_5$glycidyl ether, p-tert-butylphenyl glycidyl ether, diglycidyl adipate, diglycidyl phthalate, glycidyl methacrylate and butyl glycidyl ether.

The content of the acryloxy group-containing compounds, the methacryloxy group-containing compounds or the epoxy group-containing compounds is preferably used in the range of 0.5 to 5.0 part by weight, especially 1.0 to 4.0 part by weight based on 100 parts by weight of EVA.

Examples of the cross-linking auxiliaries (compounds except the acryloxy and methacryloxy group containing compounds) include trifunctional cross-linking auxiliaries such as triallyl cyanurate and triallyl isocyanurate, and bifunctional crosslinking auxiliaries of (meth)acryl esters (e.g., NK Ester, etc.). The crosslinking auxiliary is preferably used in the range of not more than 10 part by weight, especially 0.1 to 5 part by weight based on 100 parts by weight of EVA.

The solar cell sealing film may further contains an ultraviolet absorbent, a photostabilizer and an antioxidant additionally.

Examples of the ultraviolet absorbents, though are not particularly restricted, include benzophenone-type ultraviolet absorbents such as 2-hydroxy-4-methoxybenzophenone, 2-hydroxy-4-n-dodecyloxybenzophenone, 2,4-dihydroxybenzophenone, 2,2'-dihydroxy-4-methoxybenzophenone, and 2-hydroxy-4-n-octoxybenzophenone. The content of the benzophenone-type ultraviolet absorbent preferably is in the range of 0.01 to 5 parts by weight based on 100 parts by weight of EVA.

A hindered amine photostabilizer can be preferably used as the photostabilizer. Examples of the photostabilizers include LA-52, LA-57, LA-62, LA-63, LA-63p, LA-67 and LA-68 (each manufactured by ADEKA Co., Ltd.), Tinuvin 744, Tinuvin 770, Tinuvin 765, Tinuvin 144, Tinuvin 622LD, and CHIMASSORB 944LD (each manufactured by Ciba Specialty Chemicals Co., Ltd.), and UV-3034 (each manufactured by B. F. Goodrich). The photostabilizers can be each used singly, or in combination of two or more kinds. The content of the photostabilizer preferably is in the range of 0.01 to 5 parts by weight based on 100 parts by weight of EVA.

Examples of the antioxidants include hindered phenol-type antioxidants such as N,N'-hexan-1,6-diyl-bis[3-(3,5-di-tert-butyl-4-hydroxyphenyl)propionamide], phosphorus-type heat stabilizers, lactone-type heat stabilizers, vitamin E-type heat stabilizers and sulfur-type heat stabilizers.

The solar cell sealing film can be formed according to known processes by using a resin composition comprising ethylene-vinyl acetate copolymer, absorbent, crosslinker and if necessary other additives. The solar cell sealing film can be formed, for example, by extending the composition under application of pressure and heating, for example, by using extrusion molding. The heating temperature at the film-formation preferably is in the range of 50 to 90° C. such that the crosslinker is not decomposed.

The structure of the solar cell is not particularly restricted, as long as the solar cell sealing film according to the invention is used. For example, there can be mentioned the structure comprising a transparent light-receiving side protection material, a backside protection material and photovoltaic elements sealed therebetween with the sealing films of the invention, which is obtained by curing the sealing films and combining them. In this case, the sealing film(s) of the invention are used as sealing film(s) disposed on the light-receiving side and/or the backside of the photovoltaic elements of the solar cell.

In the invention, the backside corresponds to the reverse side of the light-receiving side of the photovoltaic elements.

The solar cell is prepared using the sealing film as shown in FIG. 1. In more detail, a transparent light-receiving side protection material 1, a light-receiving side sealing film 3A, photovoltaic elements 4, a backside sealing film 3B and a backside protection material 2 are superposed to prepare a laminate and the laminate is bonded according to a conventional process. In more detail, the laminate can be bonded under the application of pressure and heat by using a vacuum laminator in the conditions of temperature of 135 to 180° C. (preferably 140 to 170° C., especially 140 to 160° C.), degassing time period of 0.1 to 5 min., pressing pressure of 0.1 to 1.5 kg/cm$^2$ and pressing time period of 5 to 15 min. This application of pressure and heat enables the ethylene-vinyl acetate copolymer contained in the light-receiving side sealing film 3A and the backside sealing film 3B to crosslink, whereby the photovoltaic elements 4, the transparent light-receiving side protection material 1 and the backside protection material 2 are combined through the light-receiving side sealing film 3A and the backside sealing film 3B to seal the photovoltaic elements 4.

The solar cell sealing film of the invention can be used in not only solar cells using photovoltaic elements composed of single or poly crystal-type silicon crystal, but also thin-film solar cells such as thin-film silicon-type solar cell, thin-film amorphous silicon-type solar cell and copper selenide-induim (CIS)-type solar cell. Examples of the structures of the thin-film solar cells include a structure that the solar cell sealing film of the invention and a backside protection material are superposed on a thin-film solar cell element which is formed by chemical phase deposition method on a transparent light-receiving side protection material such as a glass plate, a polyimide substrate or a fluoro resin substrate, and the resultant laminate is bonded and united; or a structure that a transparent light-receiving side protection material, the light-receiving side sealing film, a thin-film solar cell element, the backside sealing film and a backside protection material are superposed in this order and the resultant laminate is bonded and united.

In the invention, the backside sealing film preferably contains further a colorant. In case the backside sealing film containing the colorant is used, a light is reflected on an interface between the backside sealing film and the light-receiving side sealing film or diffusely reflected on the colorant. Therefore, a light incident between the photovoltaic elements or a light passed through the photovoltaic elements is diffusely reflected whereby the light is incident upon the photovoltaic elements again. Hence, a light incident upon a solar cell can be efficiently utilized to enhance the generating efficiency.

The transparent light-receiving side protection material used in the solar cell of the invention generally is a glass plate such as silicate glass. A thickness of the glass plate is generally in the range of 0.1 to 10 mm, preferably 0.3 to 5 mm. The glass plate is tempered in heat or chemical resistance.

The backside protection material of the invention generally is a plastic film (e.g., PET), but preferably fluorinated polyethylene film (polyfluoroethylene film) from the viewpoint of heat resistance.

The solar cell (including a thin-film solar cell) of the invention is characterized in use of the specific sealing films provided on a light-receiving side and backside. Therefore as materials used in components other than the sealing film (i.e., transparent light-receiving side protection material, backside protection material, photovoltaic elements, etc.), those used in a known solar cell can be used, which are not particularly restricted.

EXAMPLE

The invention is illustrated in detail using the following Examples.

The invention is not restricted by the following Examples.

Example 1

EVA Resin
(content of vinyl acetate based on 100 wt. parts: 25 wt. parts): 100 wt. parts
Crosslinker (2,5-dimethyl-2,5-bis(t-butylperoxy)hexane): 0.6 wt. part
Crosslinking auxiliary (triallyl isocyanurate): 1 wt. part
Additive (γ-methacryloxypropyl trimethoxy silane): 0.5 wt. part
Synthetic hydrotalcite
($Mg_{4.5}Al_2(OH)_{13}CO_3 \cdot 3.5H_2O$; mean particle size: 0.5 μm; refractive index: 1.51; pH=9.5; trade name: HT-P; available from Sakai Chemical Industry Co., Ltd.): 0.1 wt. part The above-mentioned formulation for a sealing film was introduced into a roll mill and mixed at 80° C. to prepare a resin composition. The resin composition was subjected to calendaring processing and cooled to prepare a sealing film (thickness: 0.6 mm).

Examples 2-7

The procedures of Example 1 were repeated except for using the synthetic hydrotalcite (HT-P) of the sealing film formulation in an amount (0.2 to 1.5 wt. part) shown in the following Table 1 to prepare a sealing film.

Examples 8-9

The procedures of Example 1 were repeated except for using $Mg_{4.3}Al_2(OH)_{12}CO_3 \cdot H_2O$ (mean particle size: 0.5 μm; refractive index: 1.51; pH=9.5; trade name: DHT-4; available from Kyowa Chemical Industry Co., Ltd.) instead of the synthetic hydrotalcite (HT-P) of the sealing film formulation in an amount (0.5 to 0.7 wt. part) shown in the following Table 1 to prepare a sealing film.

Comparison Example 1

The procedures of Example 1 were repeated except for not using the synthetic hydrotalcite (HT-P) of the sealing film formulation to prepare a sealing film.

Comparison Example 2

The procedures of Example 1 were repeated except for using the synthetic hydrotalcite (HT-P) of the sealing film formulation in an amount of 6.0 wt. parts to prepare a sealing film.

Comparison Example 3

The procedures of Example 1 were repeated except for using magnesium oxide (mean particle size: 0.7 μm; refractive index: 1.7) instead of the synthetic hydrotalcite (HT-P) of the sealing film formulation in an amount of 0.5 wt. part to prepare a sealing film.

Comparison Example 4

The procedures of Example 1 were repeated except for using zinc oxide (mean particle size: 0.3 μm; refractive index: 1.95) instead of the synthetic hydrotalcite (HT-P) of the sealing film formulation in an amount of 0.5 wt. part to prepare a sealing film.

(Evaluation of Sealing Film and Solar Cell)

The evaluations of the sealing films and solar cells obtained above were carried out according to the following procedures.

1. Measurement of Generation Amount of Acetic Acid (1)

The obtained sealing film is interposed between a glass plate (thickness: 3 mm) as a transparent light-receiving side protection material 1 and a fluorinated polyethylene film (thickness: 50 μm) as a backside protection material 2 to prepare a laminate, and the laminate is temporarily bonded under application of pressure at 90° C. by using a vacuum laminator and crosslinked in an oven (155° C.) for 20 minutes.

(2)

After the crosslinking, the laminate is allowed to stand in the environment of temperature of 121° C. and humidity of 100% RH for 240 hours, and then the generation amount of acetic acid is determined in the following manner.

(3)

After the completion of the above test, the sealing is taken out of the laminate. 0.5 g of the sealing film is immersed in 2.0 ml of acetone at room temperature (25° C.) for 48 hours, and the amount (ppm) of acetic acid contained in the acetone extract is determined quantity by gas chromatography.

2. Measurement of Optical Properties (1)

The obtained sealing film (thickness: 0.6 mm) is interposed between two glass plates (thickness: 3 mm), and the resultant laminate is temporarily bonded under application of pressure at 90° C. by using a vacuum laminator and crosslinked in an oven (155° C.) for 45 minutes.

(2) Haze

Haze value (%) of the laminate obtained in (1) is measured according to JIS K 7136 (2000) by using a turbidity meter (NDH 2000, available from NIPPON DENSHOKU INDUSTRIES CO., LTD.) The results are shown in Table 1.

(3) All Light Transmittance

All light transmittance of the laminate obtained in (1) is measured in the thickness direction by using a spectral photometer (U 4000, available from Hitachi, Ltd.).

The results are shown in Table 1.

TABLE 1

| | | Ex. 1 | Ex. 2 | Ex. 3 | Ex. 4 | Ex. 5 | Ex. 6 | Ex. 7 | Ex. 8 | Ex. 9 | Co. Ex. 1 | Co. Ex. 2 | Co. Ex. 3 | Co. Ex. 4 |
|---|---|---|---|---|---|---|---|---|---|---|---|---|---|---|
| Formulation (wt. parts) | EVA*[1] | 100 | 100 | 100 | 100 | 100 | 100 | 100 | 100 | 100 | 100 | 100 | 100 | 100 |
| | Crosslinker*[2] | 0.6 | 0.6 | 0.6 | 0.6 | 0.6 | 0.6 | 0.6 | 0.6 | 0.6 | 0.6 | 0.6 | 0.6 | 0.6 |
| | Crosslinking auxiliary*[3] | 1.0 | 1.0 | 1.0 | 1.0 | 1.0 | 1.0 | 1.0 | 1.0 | 1.0 | 1.0 | 1.0 | 1.0 | 1.0 |
| | Additives*[4] | 0.5 | 0.5 | 0.5 | 0.5 | 0.5 | 0.5 | 0.5 | 0.5 | 0.5 | 0.5 | 0.5 | 0.5 | 0.5 |
| | Synthetic hydrotalcite (1)*[5] | 0.1 | 0.2 | 0.3 | 0.5 | 0.7 | 1.0 | 1.5 | — | — | — | 6.0 | — | — |
| | Synthetic hydrotalcite (2)*[6] | — | — | — | — | — | — | — | 0.5 | 0.7 | — | — | — | — |
| | Magnesium oxide | — | — | — | — | — | — | — | — | — | — | — | 0.5 | — |
| | Zinc oxide | — | — | — | — | — | — | — | — | — | — | — | — | 0.5 |
| Evaluation | Amount of Acetic acid[ppm] | 500 | 420 | 350 | 200 | 200 | 210 | 200 | 200 | 200 | 600 | 180 | 50 | 150 |
| | Haze | 1.0 | 1.4 | 2.1 | 2.9 | 4.0 | 5.8 | 8.5 | 4.1 | 5.3 | 0.5 | 27 | 36 | 88 |
| | Transmittance | 87.5 | 87.3 | 87.1 | 86.9 | 86.8 | 86.8 | 86.8 | 86.8 | 86.9 | 87.7 | 85.8 | 85.7 | 54.0 |

Note)
*[1]Content of vinyl acetate based on 100 wt. parts: 25 wt. parts
*[2]2,5-Dimethyl-2,5-bis(t-butylperoxy)hexane
*[3]Ttriallyl isocyanurate
*[4]γ-Methacryloxypropyl trimethoxy silane
*[5]HT-P (structure formula: $Mg_{4.5}Al_2(OH)_{13}CO_3 \cdot 3.5H_2O$)
*[6]DHT-4 (structure formula: $Mg_{4.3}Al_2(OH)_{12}CO_3 \cdot H_2O$)

As shown in Table 1, the solar cell using the solar cell sealing film of the invention acquires excellent transparency with suppression of occurrence of acetic acid. Hence it is apparent that the solar cell of the invention has high generating efficiency.

| Description of the reference numbers | |
|---|---|
| 1: | Transparent light-receiving side protection material |
| 2: | Backside protection material |
| 3A: | Light-receiving side sealing film |
| 3B: | Backside sealing film |
| 4: | Photovoltaic element |

The invention claimed is:

1. A solar cell sealing film comprising ethylene-vinyl acetate copolymer, an organic peroxide and an adsorbent, wherein said adsorbent comprises hydrotalcite in an amount of 0.3 to 0.7 parts by weight based on 100 parts by weight of the ethylene-vinyl acetate copolymer, said hydrotalcite being represented by the following chemical formula:

$$Mg_{4.5}Al_2(OH)_{13}CO_3.3.5H_2O.$$

2. The solar cell sealing film as defined in claim 1, wherein the vinyl acetate of the ethylene-vinyl acetate copolymer is contained in an amount of 5 to 50 parts by weight based on 100 parts by weight of the ethylene-vinyl acetate copolymer.

3. The solar cell sealing film as defined in claim 1, wherein the organic peroxide is contained in an amount of 0.1 to 5.0 parts by weight based on 100 parts by weight of the ethylene-vinyl acetate copolymer.

4. A solar cell wherein a solar cell sealing film as defined in claim 1 is incorporated.

* * * * *